United States Patent [19]

Chiang

[11] Patent Number: 4,897,378

[45] Date of Patent: Jan. 30, 1990

[54] PREPARATION OF THIN FILM SUPERCONDUCTING OXIDES

[75] Inventor: Yet-Ming Chiang, Ashland, Mass.

[73] Assignee: Massachusetts Institute of Technology, Cambridge, Mass.

[21] Appl. No.: 123,929

[22] Filed: Nov. 23, 1987

Related U.S. Application Data

[63] Continuation-in-part of Ser. No. 53,058, May 22, 1987.

[51] Int. Cl.$^4$ .................. B05D 5/12; C01B 15/04; C01F 17/00; C04B 35/05
[52] U.S. Cl. ............................ 505/1; 427/62; 427/63
[58] Field of Search ............... 505/1; 427/62, 63

[56] References Cited

U.S. PATENT DOCUMENTS

| | | | |
|---|---|---|---|
| 3,330,697 | 7/1967 | Pechini | 427/79 |
| 3,898,183 | 8/1975 | Sugier et al. | 252/462 |
| 4,022,584 | 5/1977 | Rudy | 428/545 |
| 4,050,147 | 9/1977 | Winter et al. | 29/599 |

FOREIGN PATENT DOCUMENTS 56-85814 7/1981 Japan .

OTHER PUBLICATIONS

Wang et al., *Inorganic Chemistry*, 26, 1474, pp. 1474–1476, May, 1987.
Blank et al., *Physica* 145 B (1987) 222–226.
McCallum et al., *Adv. Ceram. Mat'ls.*, vol. 2, No. 3B, Jul. 1987, pp. 388–400.
Moyseev et al., *Fiz. Nizk. Temp.*, 13 (6), Jun. 87, pp. 648–651.

*Primary Examiner*—Norman Morgenstern
*Assistant Examiner*—Margaret Bueker

[57] ABSTRACT

Cations such as La, Sr, Cu, or Y, Ba, Cu are dissolved in an organic solvent such as ethylene glycol and citric acid. The solution is formed into either a free-standing or supported film which is dried to produce a solid organic polymer. The polymer is then fired in an oxidizing atmosphere (pyrolysis) to obtain the superconducting oxide. It is preferred that the film be spin coated on a substrate to produce uniform coatings of thicknesses less than one micrometer. The resulting superconducting oxide film is fully dense, of controlled microstructure, very homogeneous in composition and suitable for demanding electronic device purposes or as coatings to form superconducting wires or other current carrying components.

67 Claims, 3 Drawing Sheets

PREPARATION OF THIN FILM SUPERCONDUCTING OXIDES

REFERENCE TO RELATED APPLICATION

This application is an continuation-in-part of U.S. Pat. application Ser. No. 053,058, filed May 22, 1987.

BACKGROUND OF THE INVENTION

This invention relates to the preparation of thin superconducting oxide films.

Superconductors are materials having substantially zero resistance to the flow of electrons below a certain critical temperature. It is known that certain metal oxides exhibit high temperature superconductivity, that is, critical temperatures greater than 30 K. Included are $La_{2-x}M_xCuO_{4-y}$, where M is an alkaline earth cation (e.g., Ba, Sr, Ca) and in which the critical temperature can be greater than 35 K, and $NBa_2Cu_3O_{7-x}$, where N can be Y, La, Eu, Gd, Tb, Dy, Ho, Er, Tm, Yb, Lu, etc. and in which the critical temperature can be greater than 90K. It is desirable to provide such oxides in a thin film or coating which is fully dense, of controlled microstructure, and very homogeneous in composition, for demanding electronic device purposes such as striplines, Josephson junction devices, superconducting quantum interference devices (SQUID) and as superconducting coatings on a support material such as a wire, sheet or coil in order to make a superconducting component.

SUMMARY OF THE INVENTION

According to the invention, an organic liquid solution containing the cation constituents of the oxide film is made. This liquid contains an organic acid such as citric acid, lactic acid, or glycolic acid capable of chelating with the metal cation constituents, and an alcohol such as ethylene glycol or glycerol capable of polymerizing the acid chelate. The result is an organic solution containing the intimately mixed and chelated metal ions. The solution is formed into a liquid film which is dried, and then heated to form a solid organic polymer or resin. The solid polymer or resin is fired (pyrolyzed) in oxidizing atmosphere to obtain the superconducting oxide. The film may be free standing or supported on a substrate (where substrate is taken to mean any form of support such as ribbons, sheets, wires, tubes, coils, etc.) and has a thickness that may be less than one micrometer.

In a preferred embodiment, cation compounds such as $La_2O_3$, $SrCO_3$, $CuO$ or $Y_2O_3$, $BaCO_3$, $CuO$ are dissolved in ethylene glycol and citric acid. The metals themselves (La, Sr, Cu, Y, Ba, etc.) may be directly dissolved in the ethylene glycol and citric acid. The resulting liquid is spin coated onto a flat substrate or dip coated or spray coated onto a wire, coil, sheet, mesh or other forms, and allowed to dry. The solid polymer is fired in an oxidizing environment leaving the superconducting oxide film. In another embodiment, a free standing film is made by dipping a wire frame or mesh into the liquid solution and then slowly drying the film so that a solid film is obtained. Alternatively, a film can be spread onto a substrate to which it does not adhere, and separated when it is dry to produce a free standing film.

The thin films which are synthesized using the methods of the present invention have unique microstructures and properties. Very thin (from a few hundred Angstroms to greater than a micrometer thickness), yet fully dense films are possible in a single coating and firing step. Films having thicknesses in the range of 0.02-1.5 micrometers or greater with fully dense microstructures can be made by the methods of the present invention. The initial grain microstructure is very uniform and fine, with individual grain sizes of one-half micrometer or less. With subsequent thermal treatments, and with the use of specific crystalline substrates, the grain size and morphology and its orientation relative to the substrate can be controlled over wide range, up to and including substantially single crystalline films. The films are, most importantly, superconducting, with properties superior to the same compositions when prepared in bulk form due to the control over microstructure and composition which can be exercised.

The present process of making superconducting oxide thin films has several advantages over conventional high-vacuum electronic thin film processing methods such as sputter-deposition, electron beam deposition, and molecular beam epitaxy. The present process is simpler, far more economical, and a broader range of film compositions can be made, i.e., many different cation constituents can be easily incorporated into the film. Furthermore, for a given composition the concentration of each constituent can be accurately controlled (to better than 1%). The films produced by the process disclosed herein are extremely homogeneous and better control over film composition and microstructure is possible than with other techniques. Also, supports which are not flat such as wires and more complex forms can be uniformly coated.

The present process is also advantageous when compared to chemical processes of preparing a ceramic thin film, such as precipitation or so-called sol-gel techniques. The present process is a closed system in that all cation constituents in the organic liquid are incorporated into the solid film. The present process is consequently not as sensitive to solution chemistry, since there are no precipitation steps in which the rate of deposition of each desired cation constituent out of liquid solution and the physical form of the precipitant must be controlled. Homogeneity and exact control of composition are consequently better as the preferential or incomplete precipitation of a particular constituent out of solution cannot take place. In addition, since the polymer precursor does not crystallize upon drying or heating, unlike some metallo-organic precursors, compositional fractionation and disruption of the film morphology do not occur. A very broad range of cation constituents can be incorporated into the thin film as they are soluble in the acidic organic solution and the subsequent polymer. Formation of a thin film is also simpler since in the present process the organic solution wets and easily coats a variety of support materials, and since the liquid film is directly transformed into the solid superconducting film upon firing without the need for first precipitating a solid precursor from a liquid solution onto the substrate.

The flexibility of composition of the present process also allows the formation of a film in which the superconducting phase is finely mixed with a separate metallic phase which is noble with respect to the superconducting oxide. By this it is meant that the metallic phase can be prevented from oxidizing at the temperatures and atmospheres at which the superconducting oxide is formed. This mixture can be formed such that the superconducting phase is continuous and the metallic phase discrete, or vice versa, or such that both phases are interconnected. The advantages of having an admixture of a metallic phase and the superconductor include: (1) improved mechanical properties, such as strength and toughness, of the film; (2) greater ease of forming low resistance electrical contacts to the film, since the metallic phase contacts the film internally over a larger total area; (3) better adherence of the film to a substrate; and (4) improved AC properties of the film, due to the fine filamentary nature of the superconductor. These metallic phase superconductor films and coatings can be formed by dissolving into the polymer precursor a precursor to the noble metallic component, such as an oxide, carbonate, hydroxide, acetate, or citrate. They can also be formed by adding the noble metal to the superconductor polymer precursor in the form of a fine powder, or a colloidal suspension or sol. These noble metals include but are not limited to gold, silver, platinum, iridium, and rhodium.

The flexibility in compositions which can be synthesized by the present process also allows multiple layers of different compositions to be formed. These multiple layers can be formed by re-coating with a polymer solution after each firing of the underlying layer. The sequence of layers which can be formed is completely general, and can be for instance layers of different superconducting compositions, or alternating layers of non superconducting oxides and superconducting oxides. An important application is the formation of barrier or adhesion layers of another oxide between the superconducting oxide and the substrate. One example involves coating the substrate using a citric acid-ethylene glycol precursor to $SrTiO_3$ which is fired to form a dense thin film of $SrTiO_3$, upon which the superconducting thin film is formed. This barrier layer of $SrTiO_3$ inhibits possible reactions between the superconducting oxide and the substrate and promotes good adhesion.

The polymer precursor can also be used to coat a substrate on which a noble metal has been deposited, for example by the processes of sputtering or evaporation. The noble metal can serve as a barrier to prevent reactions between the substrate and the film, or to promote better adhesion of the film, or to facilitate the making of low resistance electrical contacts to the film.

DESCRIPTION OF THE PREFERRED EMBODIMENTS

Figure 2:
FIG. 2 is a scanning transmission electron microscope photomicrograph of a dense superconducting $La_{1.85}Sr_{0.15}CuO_{4-y}$ thin film of critical temperature greater than 30K formed on a polycrystalline aluminum oxide substrate.

The preferred embodiments of the invention are described by way of the following examples.

The Organic Solution

Individual stock solutions of citric acid and ethylene glycol were made, of pH 1 to 3, into which $La_2O_3$, CuO, $Y_2O_3$, $SrCO_3$, and $BaCO_3$ were each separately dissolved. Other alkoxides, hydroxides, carbonates and oxides of alkaline earth or rare earth cations or transition metal cations are similarly soluble. Other forms of Cu such as Cu carbonate, Cu hydroxide, and $Cu_2O$ are also soluble. Nitrates of the metals are not preferred, however, since upon heating the evolution of $NO_x$ gases causes bubbling and disruption of the film before it has formed a hard resin. The metals themselves may also be directly dissolved. When the metals are dissolved directly, oxygen to form the superconducting oxide films comes from the solution or from the oxidizing environment during firing. These individual stock solutions are then mixed in the proportions necessary to obtain desired final compositions. Alternatively, all of the cations or cation compounds necessary for a desired composition can be simultaneously dissolved in a single batch of citric acid and ethylene glycol.

EXAMPLE I

La-Sr-Cu-O (A)

500 ml ethylene glycol
400 gm citric acid monohydrate
20 gm $La_2O_3$ (B)

500 ml ethylene glycol
400 gm citric acid monohydrate
20 gm CuO (C)

$SrCO_3$

Stock solutions (A) and (B) are assayed to determine the exact concentration of La and Cu per unit volume or unit weight of the solution, and then weighed amounts of the solutions are mixed in the desired proportions, and $SrCO_3$ is added in the correct amount to obtain a final composition (after firing) of $La_{1.825}Sr_{0.175}CuO_{4-y}$. In one example solution (A) after heating and mixing is assayed to have a La concentration of $1.64 \times 10^{-4}$ moles La/ml, and (B) has $1.75 \times 10^{-4}$ moles Cu/ml, and a mixture of 145 ml of (A), 75 ml of (B), and 0.3372 g of $SrCO_3$ yields a solution which can form about 5 gms of $La_{1.825}Sr_{0.175}CuO_{4-y}$. The mixture is heated to less than 100° C. while stirring, in order to dissolve the $SrCO_3$ and mix homogeneously.

EXAMPLE II

Y-Ba-Cu-O $Y_2O_3$ is substituted for $La_2O_3$ in solution (A) above. After assaying it is mixed with solution (B) in the correct measured amount, and the correct weight of $BaCO_3$ added, in order to obtain a homogeneous liquid mixture as above, which when pyrolyzed yields a composition $YBa_2Cu_3O_{7-x}$. In one example solution (A) is assayed to have $1.80 \times 10^{-4}$ moles Y/gm, (B) to have $1.20 \times 10^{-4}$ moles Cu/gm, so that a mixture of 49.45 gm of solution (A), 187.57 gm of (B), and 2.960 gm of $BaCO_3$ yields a solution from which about 5 gms of $YBa_2Cu_3O_{7-x}$ can be made.

EXAMPLE III

Y-Ba-Cu-O 200 grams of citric acid monohydrate are melted while stirring at a temperature of 100°-150° C. Into this acidic solution is dissolved 8.468 gm $Y_2O_3$ and 29.720 gm. $BaCO_3$, while stirring continuously. Water can be added in small amounts to replace that which may evaporate. Then, 25.788 gm. $CuCO_3$, $Cu(OH)_2$ is added while stirring, with the temperature maintained at no greater than 80° C. A transparent dark blue solution is obtained, which can then be either used as is or mixed with ethylene glycol. Proportions of one to two moles ethylene glycol per mole citric acid are appropriate. The solution without ethylene glycol addition has a concentration of 2.31 moles per liter of total cations (corresponding to 0.385 moles $YBa_2Cu_3O_{7-x}$ per liter, 4.04 volume percent $YBa_2Cu_3O_{7-x}$, and 16.48 weight percent $YBa_2Cu_3O_{7-x}$) Additions of ethylene glycol dilute the solution proportionately. For a mixture containing two moles of ethylene glycol per mole of citric acid, spin-coating to polymer film thicknesses of about 0.001" results, after firing, in a dense continuous superconducting film of about 0.7 microns thickness, like that shown in FIG. 6.

Forming a Polymer Film

The citrate organic solution, upon heating to about 100°-200° C., evaporates solvent and becomes more viscous, and eventually becomes a solid polymer or resin. This citrate polymer film, whether deposited on a substrate or free standing, loses carbon on firing in an oxidizing atmosphere (pyrolysis) and becomes a superconducting oxide. A typical firing is ½ hour at 800° C. for the $La_{1.825}Sr_{0.175}CuO_{4-y}$ and 900° C. for the $YBa_2Cu_3O_{7-x}$, following which the film is either slowly cooled at a rate of 100° C./hour or less, to room temperature, in an atmosphere of air or oxygen, or rapidly cooled and then re-heated at a temperature of 200°-500° C. in air or oxygen to fully oxidize the film. Since organics and solvents are evolved during firing, obviously the rate of heating must be slow enough that gas evolution is not sufficiently violent to disrupt the film. In practice, a heating rate of less than 40° C./hr. to greater than 500° C. is adequate, following which the heating rate may be increased.

EXAMPLE I

The film can be made in free standing form by utilizing a supporting framework to obtain a liquid film, such as by dipping a wire frame or mesh, and then slowly drying the film so that a solid polymer film is obtained. The film, when fired, yields the superconducting thin film.

EXAMPLE II

Alternatively, a film can be spread onto a substrate to which it does not adhere, and separated when dry.

EXAMPLE III

A supported (adherent) film is made by coating a substrate, which may be flat or of more complex shape, with the citrate liquid, drying, and firing. Dipping of a substrate into the liquid generally does not yield as uniform and thin a polymer film as spin coating or spray coating but can nonetheless be used. Spin coating, in which the substrate is spun at high speed while the liquid is applied, yields very uniform coatings and is the preferred method of coating flat substrates at present. The liquid can also be sprayed onto the substrate for a uniform coating. Drying of spin-coated films can be accomplished by spinning for extended times in air, or by heating the substrate and film while spinning, or by heating the substrate and film after spinning. Thinner films can be prepared by spinning at higher speed while coating, or by diluting the citrate liquid with a suitable solvent such as water or ethylene glycol.

The substrate can also be a wire or fiber, in which case a dense and continuous superconducting coating is formed on the wire to yield a superconducting wire or other component. A ribbon, coil, tube or other complex shape can also be used as the substrate. Spin coating is not applicable to these forms of substrate, but dip coating and spray coating are.

EXAMPLE IV

A coated wire or fiber can be made by passing a continuous wire through the polymer solution, or by spray-coating of the wire, followed by drying and firing. Metallic wires as well as non metallic fibers such as glass fibers or silicon carbide fibers (Nicalon) or alumina fibers or silicon carbide CVD filaments are suitable for coating. Also, carbon coated with silicon carbide may be used as a substrate.

Formation of the thin polymer film is facilitated by the use of a substrate material which is wet, or partially wet, by the citrate liquid. Ceramic substrates which can be used include $SiO_2$, SiC, Si, $SrTiO_3$, $BaTiO_3$, MgO, $Al_2O_3$, and $ZrO_2$. Films are less likely to crack upon cooling to temperatures where they are superconducting when the thermal expansion coefficient of the substrate is relatively high, as it is for $SrTiO_3$, $BaTiO_3$, MgO and $ZrO_2$. Metallic substrates can also be used, including copper, iron, stainless steel, nickel, platinum, cobalt, gold, tantalum, and their alloys.

Single crystalline substrate materials can be used for the purpose of inducing preferred crystalline orientation in the thin film and/or preferred grain size and orientation if the film is polycrystalline. The film can also be of varying porosity and greater thickness if desired. These characteristics are controlled by varying the cation content in the organic solution, the thickness of the polymer film, firing conditions, and other processing parameters. The process can also be repeated to build up layer thickness or to fill in porosity in the film.

Figure 3:
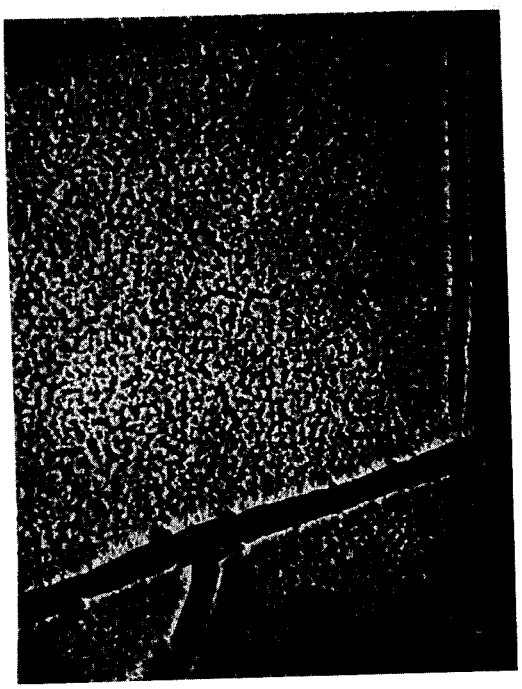
FIG. 3 is a photomicrograph of a thicker film of the material of FIG. 2 which is not fully dense but is also superconducting.
Figure 1:
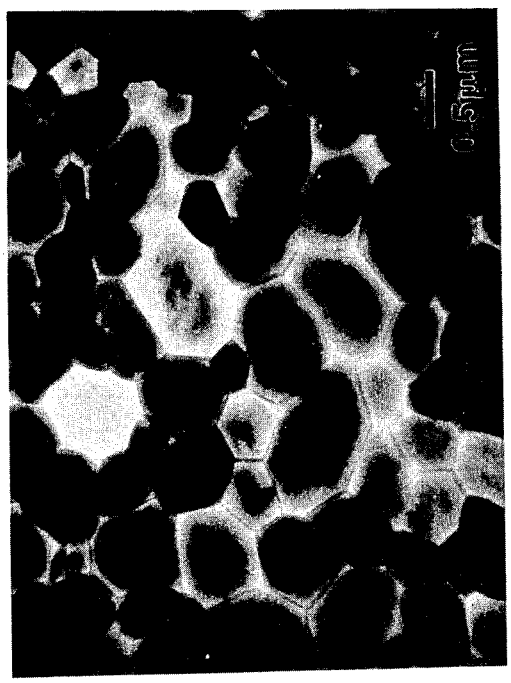
FIG. 1 is a scanning transmission electron microscope photomicrograph of a free standing superconducting thin film of $La_{1.85}Sr_{0.15}CuO_{4-y}$ with a critical temperature greater than 30K.

FIG. 1 shows a free-standing thin film of $La_{1.85}Sr_{0.15}CuO_{4-y}$ composition which is very homogeneous in composition, as determined by energy-dispersive X-ray analysis in the scanning transmission electron microscope, as well as being uniformly thick (about 0.5 micrometers) across the film, of a uniform grain size of about 0.5 micrometers, and which measurements on bulk samples have shown to be superconducting. The film is one grain thick; i.e. the grains penetrate through the film. FIG. 2 shows a similar $La_{1.85}Sr_{0.15}CuO_{4-y}$ thin film formed on a polycrystalline aluminum oxide substrate, in which a thin (about 0.1 micrometer) continuous film coats the individual grains of aluminum oxide. This film is also completely dense, except for where cracks have occurred between grains. FIG. 3 shows a thicker film of the same material which is not fully dense, but rather is porous, derived from a thicker polymer film coating.

Figure 5:
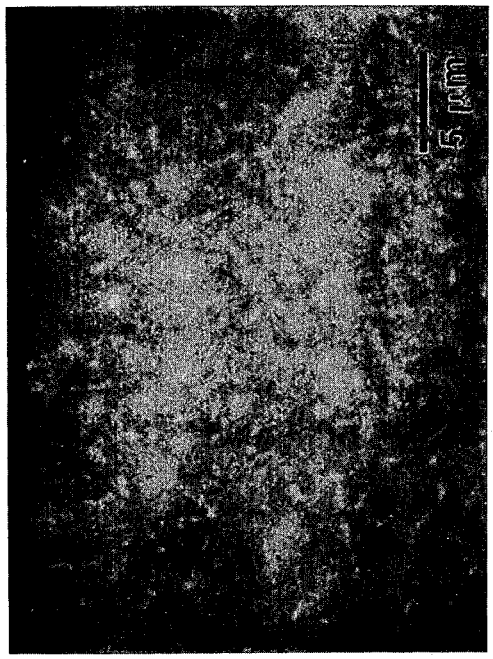
FIG. 5 is a photomicrograph of the material of FIG. 4 formed on an MgO single crystalline substrate.
Figure 4:
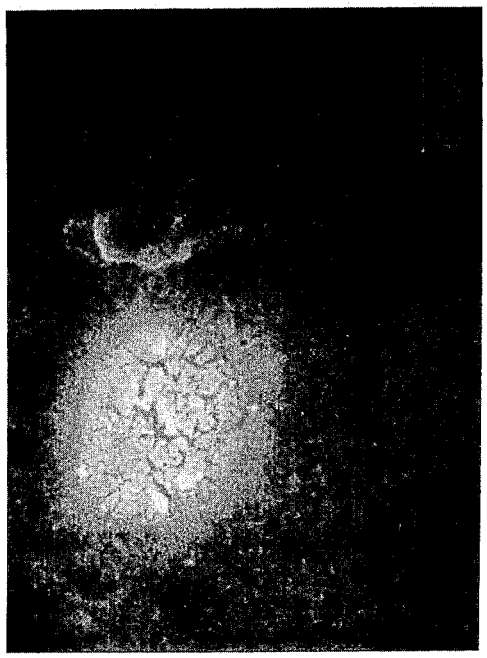
FIG. 4 is a photomicrograph of a dense superconducting $YBa_2Cu_3O_{7-x}$ film of critical temperature greater than 90K formed on an amorphous $SiO_2$ substrate.
Figure 6:
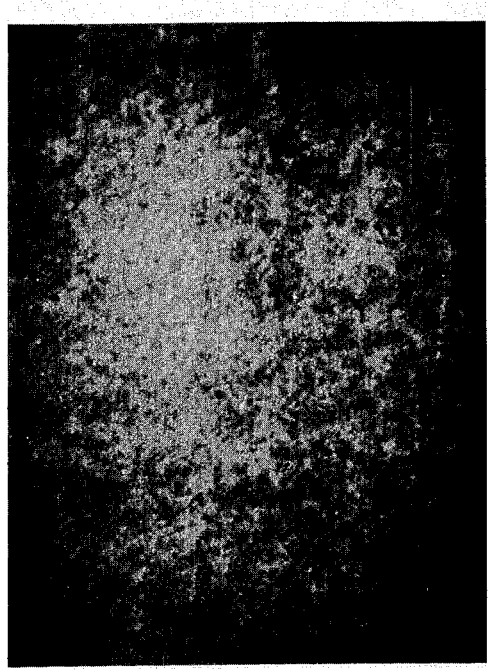
FIG. 6 is a photomicrograph of a film of the material of FIG. 4 of thickness greater than 0.5 microns which is dense and continuous, formed on a single crystal $SrTiO_3$ substrate of [001] surface orientation.
Figure 7:
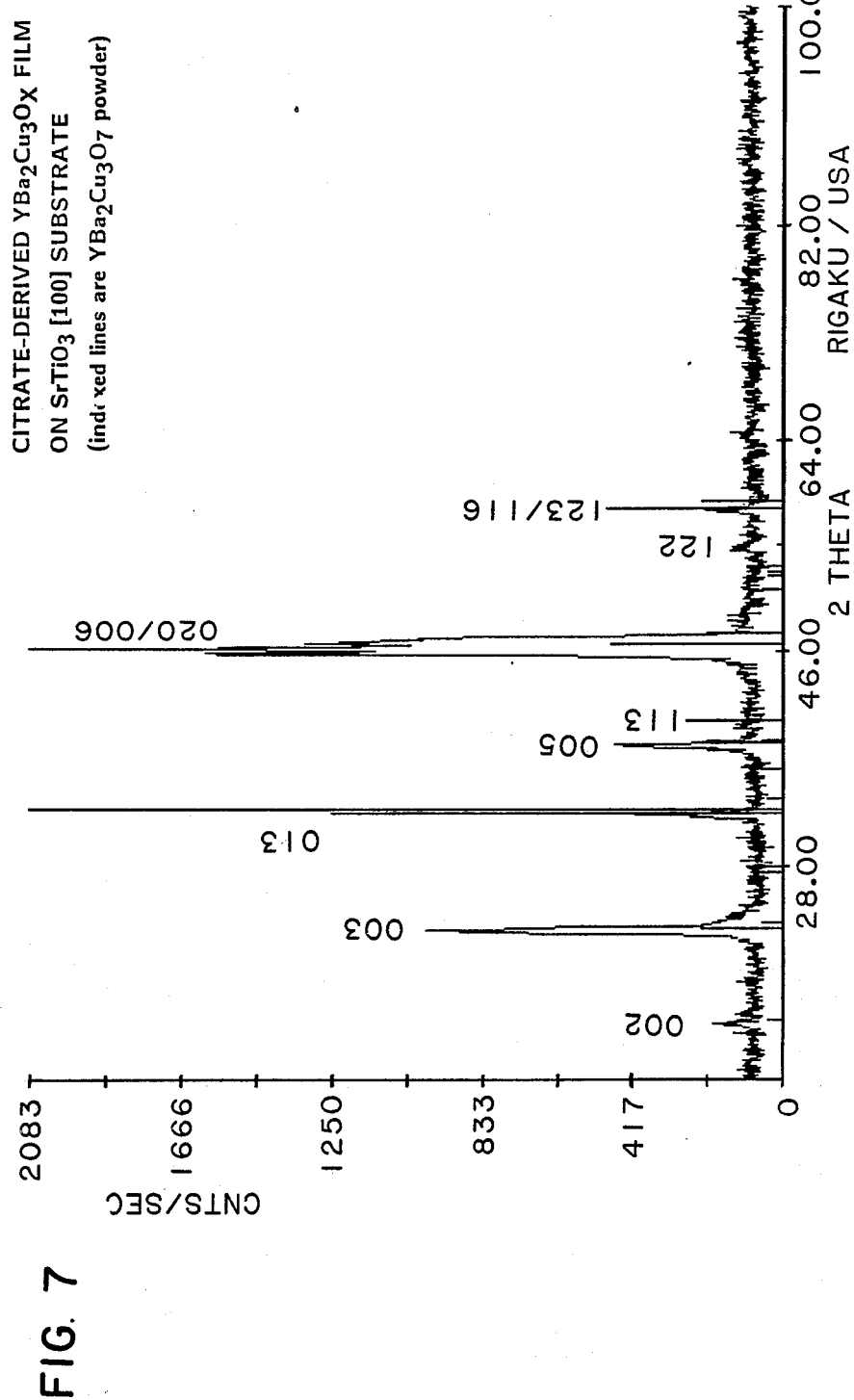
FIG. 7 is an X-ray diffractogram of the film of FIG. 6, in which the diffraction lines show that the film is, first, of the desired $YBa_2Cu_3O_{7-x}$ phase, and second, substantially epitaxially oriented so that the [001] direction of the film is parallel to the [001] direction of the substrate.

FIG. 4 shows a $YBa_2Cu_3O_{7-x}$ film formed on an amorphous $SiO_2$ substrate, which is completely continuous and very smooth. FIG. 5 shows the $YBa_2Cu_3O_{7-x}$ thin film formed on an MgO single crystalline substrate in which a small defect in a thicker portion of the film shows some cracking, while the adjacent film region is thin, continuous, and smooth. FIG. 6 shows the $YBa_2Cu_3O_{7-x}$ film formed on single crystal $SrTiO_3$ of [001] surface orientation. This film is greater than 0.5 microns thick and is fully dense and continuous. FIG. 7 shows an X-ray diffractogram from the film and substrate of FIG. 6. The diffraction lines are identified as belonging only to the $SrTiO_3$ substrate and the $YBa_2Cu_3O_{7-x}$ phase. The absence of other impurity or nonstoichiometric phases shows that the composition of the film is as intended. The strength of the (00h) lines of the $YBa_2Cu_3O_{7-x}$ lines shows that the film is substantially epitaxial relative to the substrate, such that the [001] directions of the film and the substrate are aligned parallel.

EXAMPLE V

A substrate, flat or otherwise, is first coated with a citrate precursor to $SrTiO_3$ which is made as follows. A solution containing:
 (1) 225 ml titanium tetra isopropanol
 (2) 500 ml ethylene glycol
 (3) 400 gm citric acid monohydrate
is stirred and heated to less than 100° C. until the isopropanol present has evaporated. This solution is assayed to determine the exact concentration of Ti per unit volume or unit weight of the solution, and then $SrCO_3$ is added in the correct amount to obtain a molar Sr:Ti ratio of 1:1. This citrate solution is used to coat the substrate in one of the ways described above, and fired to 600° C. in air of oxygen to yield a thin dense film of $SrTiO_3$. Then, the polymer solution which yields the superconductivity oxide is used to coat the $SrTiO_3$ film. After firing a second time, a layer of superconducting oxide on top of the $SrTiO_3$ film is formed. A $BaTiO_3$ film can be substituted for the $SrTiO_3$ by adding $BaCO_3$ in place of $SrCO_3$ to the Ti solution, in the same molar content.

Other embodiments are includes within the scope of the claims.

What is claimed is:

1. A method of preparing a copper oxide-based superconducting oxide/noble metal composite film comprising the steps of:
   making an organic liquid solution of the cation constituents of the oxide film by chelating a precursor solution containing said cation constituents with an organic acid and adding a polymerizing alcohol;
   adding a noble metal to said organic liquid solution;
   forming the solution into a liquid film;
   drying and heating the liquid film solution to obtain a solid organic polymer or resin; and
   firing the polymer to obtain the copper oxide-based superconducting oxide/noble metal composite film.

2. The method of claim 1 wherein the film is free-standing.

3. The method of claim 1 wherein the film is supported on a flat substrate.

4. The method of claim 1 wherein the film is supported on a ribbon, wire, coil or other three-dimensional substrate.

5. The method of claim 1 wherein the film thickness is less than one micrometer.

6. The method of claim 1 wherein the film is dense.

7. The method of claim 1 wherein the film is porous.

8. The method of claim 1 wherein multiple coatings are used to form thicker or more dense solid superconducting film.

9. The method of claim 2 wherein a supporting framework supports the superconducting film.

10. The method of claim 9 wherein the supporting framework is a wire frame or mesh.

11. The method of claim 10 wherein the wire frame or mesh is dipped into the organic liquid solution to form the film.

12. The method of claim 2 wherein the liquid film is spread on a substrate, dried, and separated from the substrate.

13. The method of claim 3 or 4 wherein the substrate is a single crystalline material.

14. The method of claim 3 or 4 wherein the substrate is dipped into the organic liquid solution to form a liquid film.

15. The method of claim 3 wherein the organic liquid solution is applied to a spinning substrate.

16. The method of claim 3 or 4 wherein the substrate is wet or partially wet by the organic liquid solution.

17. The method of claim 3, 4, 13, 14, 15, or 16 wherein the substrate is chosen from the group consisting of $SiO_2$, SiC, Si, $SrTiO_3$, $BaTiO_3$, MgO, $ZrO_2$, carbon coated with SiC, $Al_2O_3$, stainless steel, copper alloys, nickel alloys, cobalt alloys, gold alloys, platinum alloys and tantalum alloys.

18. The method of claim 15 wherein the film is dried by spinning in air.

19. The method of claim 15 wherein the film is dried by heating the substrate and film while spinning.

20. The method of claim 15 wherein the film is dried by heating the substrate and film after spinning.

21. The method of claim 1 wherein the cations are chosen from the group consisting of La, Ba, Cu, Y, Sr, Ca, and rare-earth ions such as Eu, Gd, Tb, Dy, Ho, Er, Tm, Yb, Lu.

22. The method of claim 1 wherein the oxide film comprises $La_{2-x}M_xCuO_{4-y}$ where M is an alkaline earth cation.

23. The method of claim 1 wherein the oxide film comprises $NBa_2Cu_3O_{7-x}$ where N is Y, or a rare-earth ion such as La, Eu, Gd, Tb, Dy, Ho, Er, Tm, Yb, Lu.

24. The method of claim 1 wherein the organic liquid solution includes ethylene glycol and citric acid.

25. The method of claim 1 wherein the cation constituents are introduced as compounds chosen from the group consisting of $La_2O_3$, CuO, $Y_2O_3$, $SrCo_3$, Cu(OH)$_2$, $CuCO_3$, $BaCO_3$, And $Cu_2O$.

26. The method of claim 20 wherein the liquid film solution is dried at a temperature in the range of 100°–200° C.

27. The method of claim 1 wherein the solid organic polymer is fired in an oxidizing atmosphere.

28. A superconducting oxide film prepared according to the method of claim 1, 3, 4, 13, 21, 22, 23, 24, or 25.

29. The method of claim 1 wherein the cations comprise La, Sr, and Cu.

30. The method of claim 1 wherein the oxide film comprises $La_{1.825}Sr_{0.175}CuO_{4-x}$.

31. The method of claim 1 wherein the cations comprise Y, Ba and Cu.

32. The method of claim 1 wherein the oxide film comprises $YBa_2Cu_3O_{7-x}$.

33. The method of claim 1 wherein the organic acid is citric acid.

34. The method of claim 1 wherein the organic acid is lactic acid.

35. The method of claim 1 wherein the organic acid is glycolic acid.

36. The method of claim 1 wherein the alcohol is ethylene glycol.

37. The method of claim 1 wherein the alcohol is glycerol.

38. The method of claim 29 wherein the polymer is fired for approximately one-half hour at approximately 800° C. and then cooled to room temperature.

39. The method of claim 31 wherein the polymer is fired for approximately one-half hour at approximately 900° C. and then cooled to room temperature.

40. The method of claim 3 wherein the substrate is a single crystalline material for inducing a preferred crystalline orientation in the thin film.

41. The method of claim 6 further comprising:
making an organic liquid solution of the cation constituents of a second superconducting oxide/noble metal composite layer by chelating a cation constituent precursor solution with an organic acid and adding a polymerizing alcohol;
forming the solution into a liquid film on the first superconducting oxide/noble metal composite layer;
drying and heating the liquid film solution to obtain a second solid organic polymer or resin;
firing the second polymer to obtain a second superconducting oxide/noble metal comprising layer; and
repeating the process for additional superconducting oxide layers.

42. Method of preparing a copper oxide-based superconducting oxide/noble metal composite film on a blocking or adhesion promoting layer supported on a substrate comprising:
making an organic liquid solution of the constituents of the blocking or adhesion promoting layer by chelating a precursor solution containing the constituents of the blocking or adhesion layer with an organic acid and adding a polymerizing alcohol;
forming this liquid into a film on the substrate;
drying and heating the liquid film to obtain a solid organic polymer;
firing the polymer to obtain the barrier or adhesion promoting layer;
making an organic liquid solution of the cation constituents of the superconducting oxide/noble metal composite film by chelating a precursor solution containing the cation constituents of the oxide with an organic acid and adding a polymerizing alcohol;
forming the solution into a liquid film on the blocking or adhesion promoting layer;
drying and heating the liquid superconducting oxide film solution to obtain a solid organic polymer or resin; and
firing the polymer to obtain the superconducting/noble metal composite layer on the blocking or adhesion promoting layer.

43. The method of claim 42 wherein the barrier or adhesion promoting layer is non-superconducting.

44. The method of claim 42 further including alternating layers of the barrier or adhesion promoting layer and the superconducting oxide layer.

45. The method of claim 42 wherein the barrier or adhesion promoting layer is the non-superconducting oxide $SrTiO_3$.

46. The method of claim 42 wherein the barrier or adhesion promoting layer is the non-superconducting oxide $BaTiO_3$.

47. The method of claim 42 wherein the barrier or adhesion promoting layer is the nonsuperconducting oxide $ZrO_2$.

48. The method of claim 1 wherein the noble metal is added as an oxide precursor.

49. The method of claim 1 wherein the metal is added as a carbonate precursor.

50. The method of claim 1 wherein the noble metal is added as an hydroxide precursor.

51. The method of claim 1 wherein the noble metal is added as an acetate precursor.

52. The method of claim 1 wherein the noble metal precursor is added as a citrate precursor.

53. The method of claim 1 wherein the noble metal is added in the form of a fine powder.

54. The method of claim 1 wherein the noble metal is added in the form of a colloidal suspension.

55. The method of claim 1 wherein the noble metal is gold.

56. The method of claim 1 wherein the noble metal is silver.

57. The method of claim 1 wherein the noble metal is platinum.

58. The method of claim 1 wherein the noble metal is irridium.

59. The method of claim 1 wherein the noble metal is rhodium.

60. A method of preparing a copper oxide-based superconducting oxide/noble method composite film on a noble metal layer supported on a substrate comprising:
depositing a noble metal on a substrate:
making an organic liquid solution of the cation constituents of the oxide film by chelating a precursor solution containing said cation constituents with an organic acid and adding a polymerizing alcohol;
adding a noble metal to the organic liquid solution;
forming the solution into a liquid film on the noble metal layer;
drying and heating the liquid film solution to obtain a solid organic polymer or resin; and
firing the polymer to obtain the superconducting oxide/noble metal composite layer on the noble metal layer.

61. The method of claim 60 wherein the noble metal is deposited by sputtering.

62. The method of claim 60 wherein the noble metal is deposited by evaporation.

63. The method of claim 60 wherein the noble metal is gold.

64. The method of claim 60 wherein the noble metal is silver.

65. The method of claim 60 wherein the noble metal is platinum.

66. The method of claim 60 wherein the noble metal is irridium.

67. The method of claim 60 wherein the noble metal is rhodium.

* * * * *

UNITED STATES PATENT AND TRADEMARK OFFICE
CERTIFICATE OF CORRECTION

PATENT NO. : 4,897,378
DATED : January 30, 1990
INVENTOR(S) : Yet-Ming Chiang

It is certified that error appears in the above-identified patent and that said Letters Patent is hereby corrected as shown below:

Column 7, line 49: change "of" (first occurrence) to -- or --.
         line 57: change "includes" to -- included --.
Column 9, line 36: change "6" to -- 1 --.
         line 48: change "comprising" to -- composite --.
Column 10, line 50: change "method" to -- metal --.

Signed and Sealed this

Thirtieth Day of April, 1991

Attest:

HARRY F. MANBECK, JR.

Attesting Officer      Commissioner of Patents and Trademarks